(12) United States Patent
Ferguson et al.

(10) Patent No.: US 6,496,382 B1
(45) Date of Patent: Dec. 17, 2002

(54) RADIO FREQUENCY IDENTIFICATION TAG

(75) Inventors: Donald Harold Ferguson, Maple; Mircea Paun, Mississauga, both of (CA)

(73) Assignee: Kasten Chase Applied Research Limited (CA)

( * ) Notice: Subject to any disclaimer, the term of this patent is extended or adjusted under 35 U.S.C. 154(b) by 82 days.

(21) Appl. No.: 09/697,023

(22) Filed: Oct. 25, 2000

Related U.S. Application Data

(63) Continuation-in-part of application No. 09/190,382, filed on Nov. 10, 1998, now Pat. No. 6,195,858, which is a division of application No. 08/926,321, filed on Sep. 5, 1997, now Pat. No. 5,914,862, which is a continuation of application No. 08/444,969, filed on May 19, 1995, now abandoned.

(51) Int. Cl.[7] .............................. H05K 1/03; H05K 1/18
(52) U.S. Cl. ..................... 361/767; 361/737; 361/739; 361/749; 361/750; 361/771; 340/572.7; 343/702; 343/895; 174/254; 174/256
(58) Field of Search ................. 361/737, 739, 361/749–751, 767, 768, 771, 774, 782, 783; 174/254, 256, 258, 261; 235/380, 487, 488, 491, 492; 257/679; 340/572.5, 572.7, 572.8; 343/702, 895; 333/185, 246, 247

(56) References Cited

U.S. PATENT DOCUMENTS

| | | | |
|---|---|---|---|
| 4,519,865 A | 5/1985 | Bradler et al. ............... 156/256 |
| 4,649,418 A | 3/1987 | Uden | |
| 4,691,202 A | 9/1987 | Denne et al. | |
| 4,829,540 A | 5/1989 | Waggener, Sr. et al. | |
| 4,864,615 A | 9/1989 | Bennett et al. | |
| 5,005,106 A | 4/1991 | Kiku ........................ 361/818 |
| 5,043,195 A | 8/1991 | Skrivseth .................. 428/35.3 |
| 5,091,229 A | 2/1992 | Golike et al. .............. 428/35.2 |
| 5,095,357 A | 3/1992 | Andoh et al. | |
| 5,124,697 A | 6/1992 | Moore | |
| 5,164,985 A | 11/1992 | Nysen et al. | |
| 5,175,033 A | 12/1992 | Havens ........................ 206/720 |
| 5,180,615 A | 1/1993 | Havens ........................ 206/720 |
| 5,226,167 A | 7/1993 | Yamaguchi .................. 395/800 |
| 5,245,521 A | 9/1993 | Spreen ......................... 363/37 |
| 5,247,332 A | 9/1993 | Taniguchi et al. | |
| 5,260,847 A | 11/1993 | Basehore et al. ........... 360/106 |
| 5,321,240 A | 6/1994 | Takahira ..................... 235/380 |
| 5,321,753 A | 6/1994 | Gritton | |
| 5,355,120 A | 10/1994 | Ferguson et al. | |
| 5,436,803 A | 7/1995 | Annis et al. ................. 361/818 |
| 5,519,201 A | 5/1996 | Templeton, Jr. ............. 235/492 |
| 5,528,222 A | 6/1996 | Moskowitz et al. ......... 340/572 |
| 5,565,837 A | 10/1996 | Godek et al. ................ 336/232 |
| 5,606,488 A | * | 2/1997 | Gustafson ................... 361/782 |
| 5,852,289 A | * | 12/1998 | Masahiko .................... 235/492 |
| 6,325,294 B2 | * | 12/2001 | Tuttle et al. ................ 235/492 |

FOREIGN PATENT DOCUMENTS

| | | |
|---|---|---|
| EP | 82306750.9 | 12/1982 |
| EP | 84303130.3 | 5/1984 |
| EP | 87110178.8 | 7/1987 |
| EP | 87111110.0 | 7/1987 |
| EP | 0595 549 | 4/1994 |
| FR | 2 604 808 | 10/1986 |
| GB | 8234163 | 12/1982 |
| GB | 8508695 | 4/1985 |
| GB | 8520476 | 8/1985 |
| GB | 8807742 | 3/1988 |
| WO | 83/01 697 | 11/1983 |
| WO | 86/04 172 | 7/1986 |
| WO | PCT/US87/00466 | 2/1987 |

* cited by examiner

*Primary Examiner*—Kamand Cuneo
*Assistant Examiner*—John B. Vigushin
(74) *Attorney, Agent, or Firm*—Marger Johnson & McCollom, P.C.

(57) ABSTRACT

A radio frequency identification tag is made with printed antenna coil integrated on a flexible substrate, and an integrated circuit area of the substrate adjacent the antenna coil for carrying circuit elements. The radio frequency identification tag is designed to be sufficiently robust to withstand the rigors of mail efficiency processing measurement applications.

16 Claims, 12 Drawing Sheets

RADIO FREQUENCY IDENTIFICATION TAG

RELATED APPLICATIONS

This application is a continuation-in-part of commonly-assigned, application U.S. Ser. No. 09/190,382 filed Nov. 10, 1998, now U.S. Pat. No. 6,195,858, which is a division of U.S. Ser. No. 08/926,321 filed Sep. 5, 1997, issued as U.S. Pat. No. 5,914,862, which is a continuation of U.S. Ser. No. 08/444,969 filed May 19, 1995, now abandoned.

FIELD OF THE INVENTION

The present invention relates in general to electromechanical circuit design, and more particularly to a flexible radio frequency identification tag for mail efficiency measurement applications.

BACKGROUND OF THE INVENTION

Traditional circuit board assemblies use rigid insulated materials to form a substrate for the mounting of electronic components. According to well known prior art designs, the signal flow between electronic components is effected by wire connections (e.g., copper traces) printed on the substrate. The electronic components themselves are connected to these wire traces via solder. The rigidity of the substrate material prevents cracking of the copper solder joint connections and insures the integrity of these connections when the device is subjected to mechanical stress.

Certain specialized applications require circuit board assemblies of size greater than approximately 4 cm$^2$ to be flexible. One such application is mail efficiency processing measurement wherein the circuit board assemblies are disposed within or on envelopes which pass through mail sorting equipment. The circuit board assemblies in such an application may be designed to incorporate low frequency antennae and associated electronic circuitry. The circuit board assembly must be designed to withstand the stresses of being passed through mechanical sorting machines.

SUMMARY OF THE INVENTION

According to the present invention, a radio frequency identification tag is provided having a printed RF coil integrated with a flexible substrate, and an integrated circuit area of the substrate adjacent the coil, wherein the integrated circuit area is reinforced to protect electrical components thereon. The radio frequency tag of the present invention is designed to endure mechanical stresses far in excess of the stresses which standard circuit board assemblies are normally subjected to. The tag of the present invention is also designed to be sufficiently thin and light for use in mail processing measurement applications.

The integrated antenna and circuit area are disposed on the same substrate thereby resulting in increased reliability and decreased complexity over prior art designs having antenna elements separate from the sensing circuit.

According to another aspect of the present invention is a method of making an identification tag, the method comprising providing a flexible substrate having an antenna portion and an integrated circuit portion; forming an antenna on the antenna portion of the substrate; forming a sensing circuit on a laminate substrate and securing the laminate substrate to the integrated circuit portion of the flexible substrate; forming a connection between the sensing circuit and the antenna on the substrate; and encapsulating the sensing circuit to form a semi-rigid area on the substrate while the antenna portion remains flexible.

BRIEF DESCRIPTION OF THE DRAWINGS

A detailed description of the preferred embodiment is provided herein below with reference to the following drawings, in which.

DETAILED DESCRIPTION OF THE PREFERRED EMBODIMENT

Figure 1A:
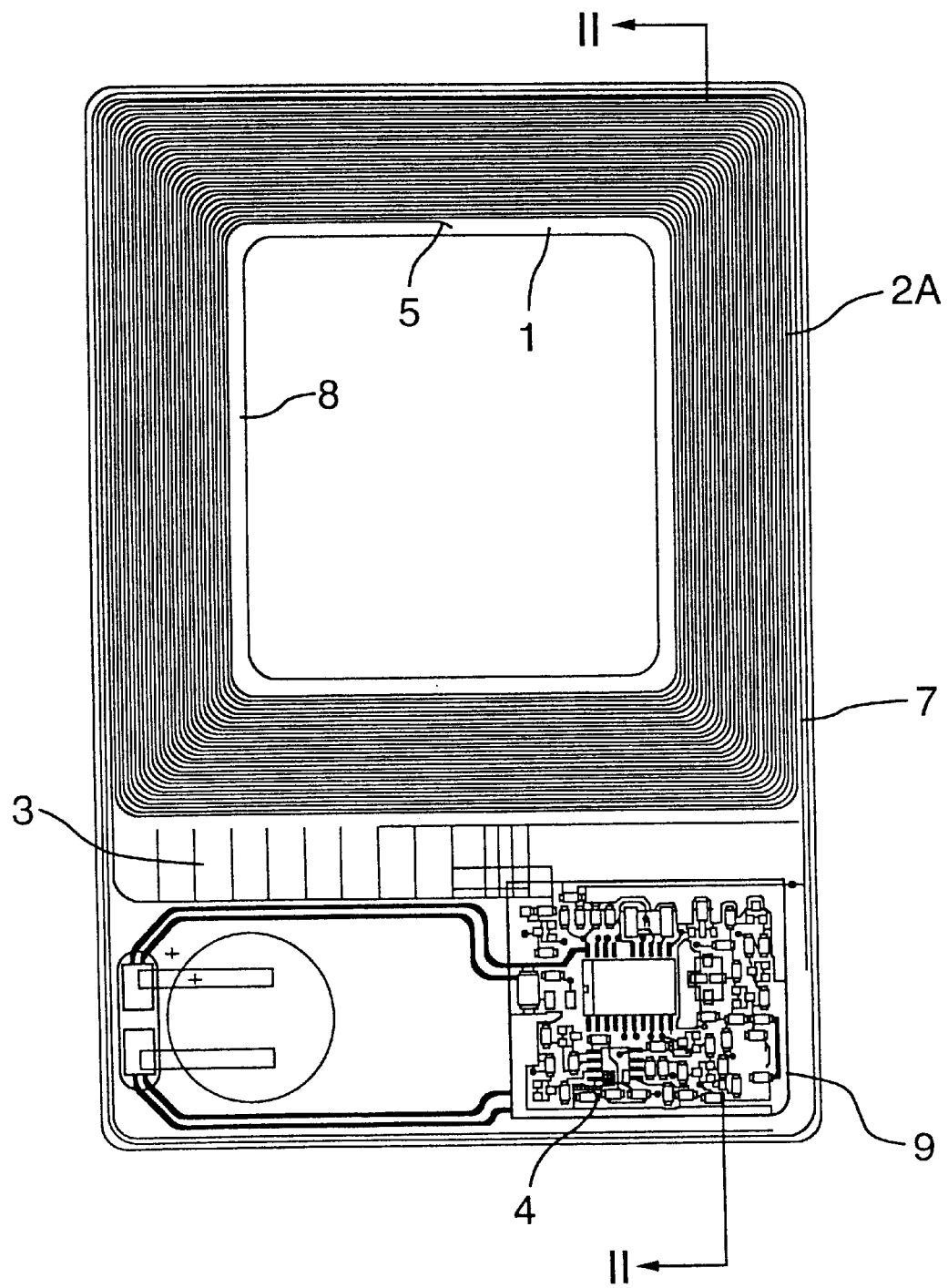
FIGS. 1A and 1B are top and bottom plan views of the radio frequency identification tag according to the present invention.
Figure 1B:
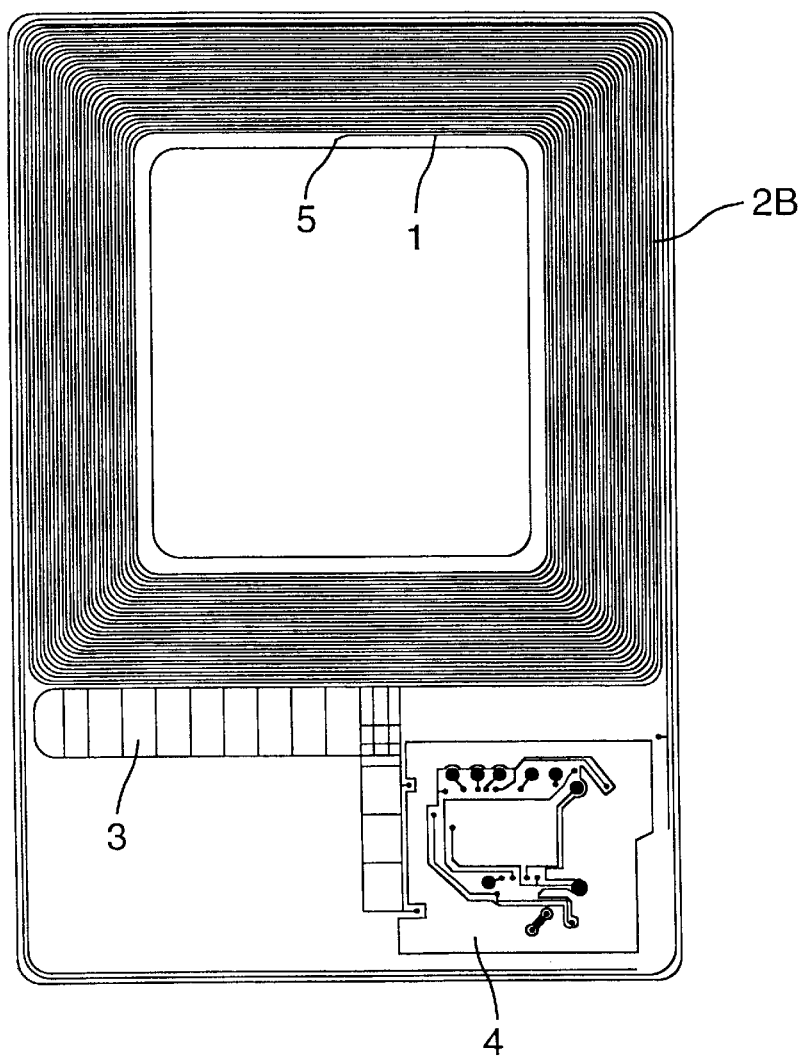
Figure 2:
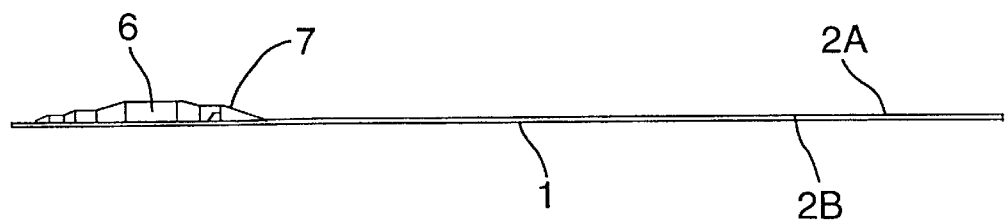
FIG. 2 is a cross-section through the line II—II in FIGS. 1A and 1B.

With reference to the FIGS. 1 and 2, a radio frequency tag is shown comprising a flexible substrate 1 on opposite sides of which a receive antenna coil 2 is provided. The antenna coil 2 comprises a first winding 2A on the top side of the substrate and a second winding 2B on the bottom of the substrate, as shown best in FIGS. 1A and 1B, respectively. The substrate 1 is preferably made from standard industrial grade epoxy glass laminate, type FR-4, such as manufactured by ADJ/Isola or NAN YA. According to the preferred embodiment, the core thickness of the substrate is made 8 mils, at Class 3 tolerance (i.e. 8±1 mil).

The size and efficiency of the antenna 2 is determined by the following variables:

1. the excitation frequency,
2. sensitivity requirements,
3. effective area of the coil,
4. number of turns of the coil,
5. Q factor of the coil, all of which are limited by
6. package size.

The size of the LF antenna 2 for the mail processing application discussed above, is limited by the postal envelope size specifications as dictated by any particular application. Antenna efficiency is optimized by maximizing antenna size and minimizing resistive losses in a tuned circuit configuration within the boundaries determined by the packaging constraints. It should be noted that for all low frequency excitation applications, the antenna 2 should be designed to be as large as possible for maximum efficiency.

Tuning of the antenna 2 in the identification tag of the present invention, is accomplished by first measuring the inductance, parasitic capacitance and resistance of the antenna at its terminals (i.e. at multiple connections 3 between the embedded antenna windings 2A and 2B and the integrated circuit area 4, discussed in greater detail below). The inductance, parasitic capacitance and resistance of the antenna 2 are measured at the intended excitation frequency (in the case of the postal tag application referred to herein above—135 KHz). Decreasing parasitic capacitance improves antenna efficiency. Once the characteristic impedance of the antenna 2 has been measured, a calculated parallel capacitance is added in order to tune the circuit to resonate at the selected excitation frequency. Turning briefly to the preferred embodiment of FIGS. 4A–4D, this capacitance is provided by capacitors C1 and C2 connected in parallel with the antenna 2.

Without the addition of an external capacitor (e.g. parallel capacitance provided by capacitor C1 and C2 in FIGS. 4A–4D), the embedded antenna 2 is characterized by its own self resonance determined by its inductance and parasitic capacitance. The desired parallel capacitance C is given by:

$$C=1/Lw^2$$

where L is the measured inductance, $W=2\pi f_0$, and $f_0$ is the excitation frequency.

It is important to note that the size, shape and number of turns of the embedded coil 2 are limited by packaging constraints and the excitation frequency ($f_0$), and that these variables may change with changes in the selected excitation frequency and packaging requirements. In order to increase the inductance of the embedded LF antenna coil 2, the windings 2A and 2B are printed on both sides of the substrate 1 and are connected together via single plated through hole 5.

According to the preferred embodiment, the antenna traces 2A on the top side of the substrate 1 are offset from the antenna traces 2B on the bottom of the substrate to minimize parasitic capacitance therebetween. The degree of offset is based on the spacing between the traces and the width of the traces themselves. Generally, the traces 2B on the underside of substrate 1 should be offset such that the middle of the width of each trace is referenced to the middle space between traces 2A on the top side of the substrate 1.

It should be noted that any application using a specific receiver frequency must have a specific design layout optimized for that frequency and application. Applications where the tag requires a different received frequency will normally require a different layout.

Circuit elements carried by the integrated circuit area 4 of the tag are interconnected via copper traces in the usual manner. According to the preferred embodiment, the copper thickness is double sided at ½ ounce per square foot. This results in a net tag thickness of 0.008 inches of core material coupled with ½ ounce copper, which results in good flexibility at low cost.

The tag of the present invention is fabricated using industry standard processes for the manufacture of flex circuit boards, with close attention being paid to the plating requirements for forming connections via the through holes from one side of the substrate 1 to the other (e.g. hole 5). Excessive plating may increase the total weight above acceptable limits and make the board less flexible, while deficient plating may increase the resistance of the antenna 2, thereby decreasing efficiency. According to the preferred embodiment, a protective solder mask coating is placed over top of the integrated circuit area 4 after etching. It should be noted that care must be taken in the application of the solder mask to ensure a thin even coat. If the solder mask is applied too thickly, the tag may exceed weight requirements for a particular application.

After processing, the printed circuit board (PCB) formed on substrate 1 is characterized by the following specifications:

Copper thickness after plating (addition-both sides-total): 0.5 mils (plus 0.2–0) mils Solder mask thickness each side: 11.4±1 mils
Total weight of the PCB: 5.5±0.5 g
Coil inductance (640±5) $\mu$H at 135 KHz
Coil Q (quality factor): 8.0±0.5 at 135 KHz In order to further optimize weight characteristics of the identification tag, portions of the substrate 1 are cut out where not required to support operative circuit elements. As shown in FIGS. 1A and 1B, a rectangular portion 8 of the substrate 1 is cut out from the center of the antenna coil windings 2A and 2B.

According to one embodiment, efficiency, selectivity and sensitivity may be further improved by gold plating the etched printed circuit board for increasing the conductivity of the traces of coil windings 2A and 2B. The resistance of each coil winding 2A, 2B may be decreased when the copper traces are gold plated. The Q value of the coil increases as a result. The Q factor is an indication of efficiency and selectivity of the coil, and is given by: $Q=2\pi f_0 L/R$, where R is the resistance of the antenna 2.

The integrated circuit area 4 is encapsulated by a tough UV (ultraviolet) adhesive 6, such as model number 35241 adhesive made by Loctite Inc. The adhesive is preferably applied by a programmable controlled automatic dispensing unit for providing consistent application of the adhesive to the integrated circuit area with components soldered thereon. An ink dam 9 is provided surrounding the integrated circuit area 4, for limiting the flow of encapsulation material. After applying the adhesive 6, the circuit board assembly is immediately placed under a UV lamp for curing. The profile of the encapsulation is as shown in FIG. 2.

Application of the UV adhesive 6 over the component area 4 reinforces that area, so that it becomes "semi-rigid". According to the present invention, this area is made semi-rigid as opposed to substantially completely rigid, because the UV adhesive 6 which is chosen for the present invention has a limited degree of flexibility so that it will not crack or fracture under stress. It has been found through experimentation that the substrate 1 experiences the greatest stress and degree of flexing at the edge of the semi-rigid area between the surface mount components in area 4 and the embedded antenna coil 2. Because of this, multiple connections 3 are utilized between the embedded antenna coil 2 and the sensing circuit disposed in area 4, in order to reduce the risk of failure should one of the connections fail due to excessive flexing.

After the UV adhesive 6 is applied and cured, a polyester film such as Mylar™ protective film 7 is applied to the integrated circuit area 4 to compensate for any discontinuities or irregularities in the application of the UV adhesive 6. The polyester film such as Mylar™ film 7 is rolled on to the encapsulated area, and the entire flexible circuit board substrate with imbedded antenna coil on both sides and the electrical connection means and then cut with a rolled die. The polyester film such as Mylar™ film 7 also minimizes any sharp edges not covered by encapsulation by the UV adhesive. This minimizes the surface stress experienced by the tag, thereby allowing it to "slip" through the rollers and belts of a sorting machine. This is useful for the intended postal tag application of the preferred embodiment. Furthermore, in applications where static electricity build up is common, the polyester film such as Mylar™ film or membrane 7 may be provided with a resistive coating having a surface resistivity of tens of mega-ohms per square inch, to reduce surface charge build up and decrease discharge current when discharge occurs.

Figure 3:
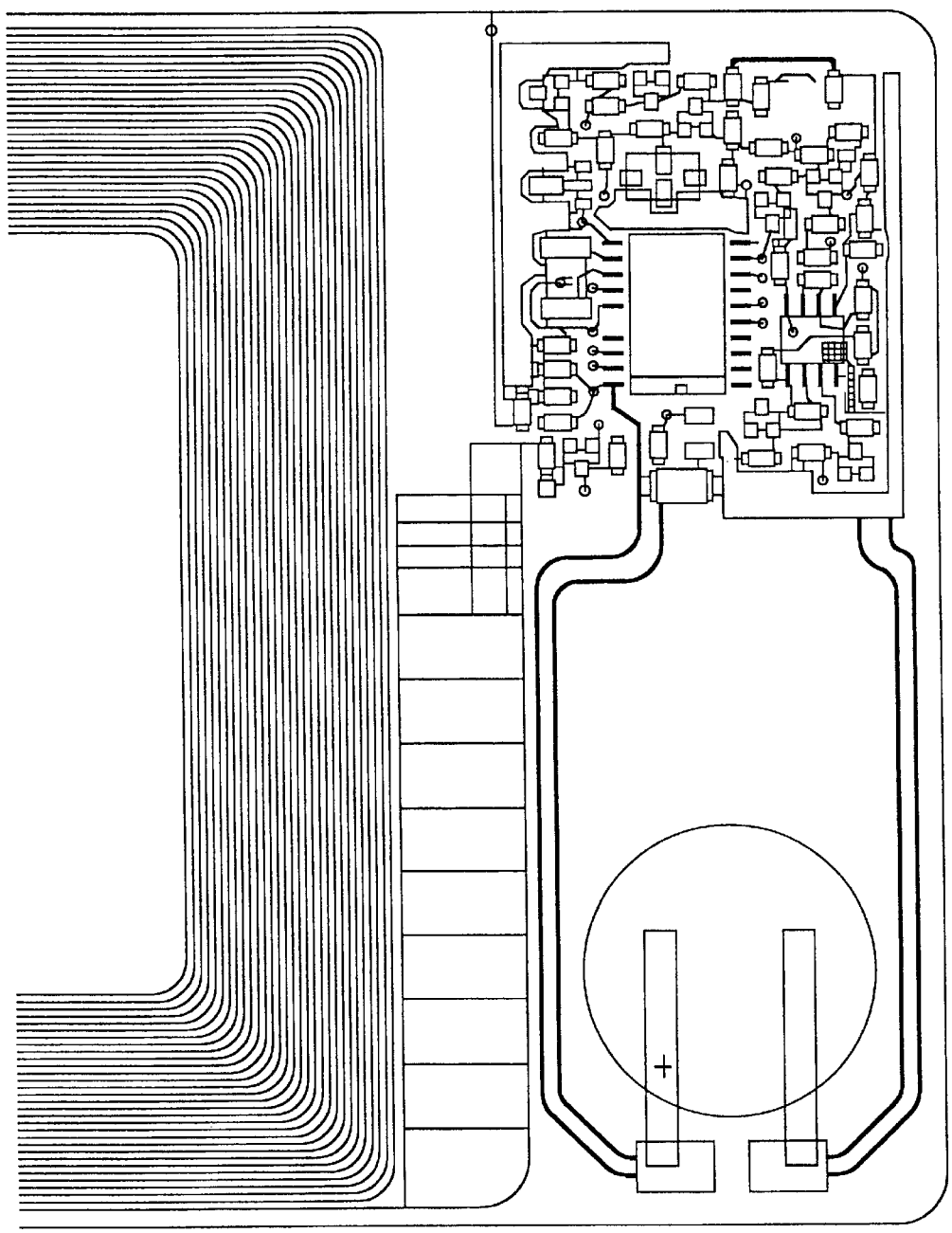
FIG. 3 is an expanded view of the portion shown in phantom outline in FIG. 1A.
Figure 4A:
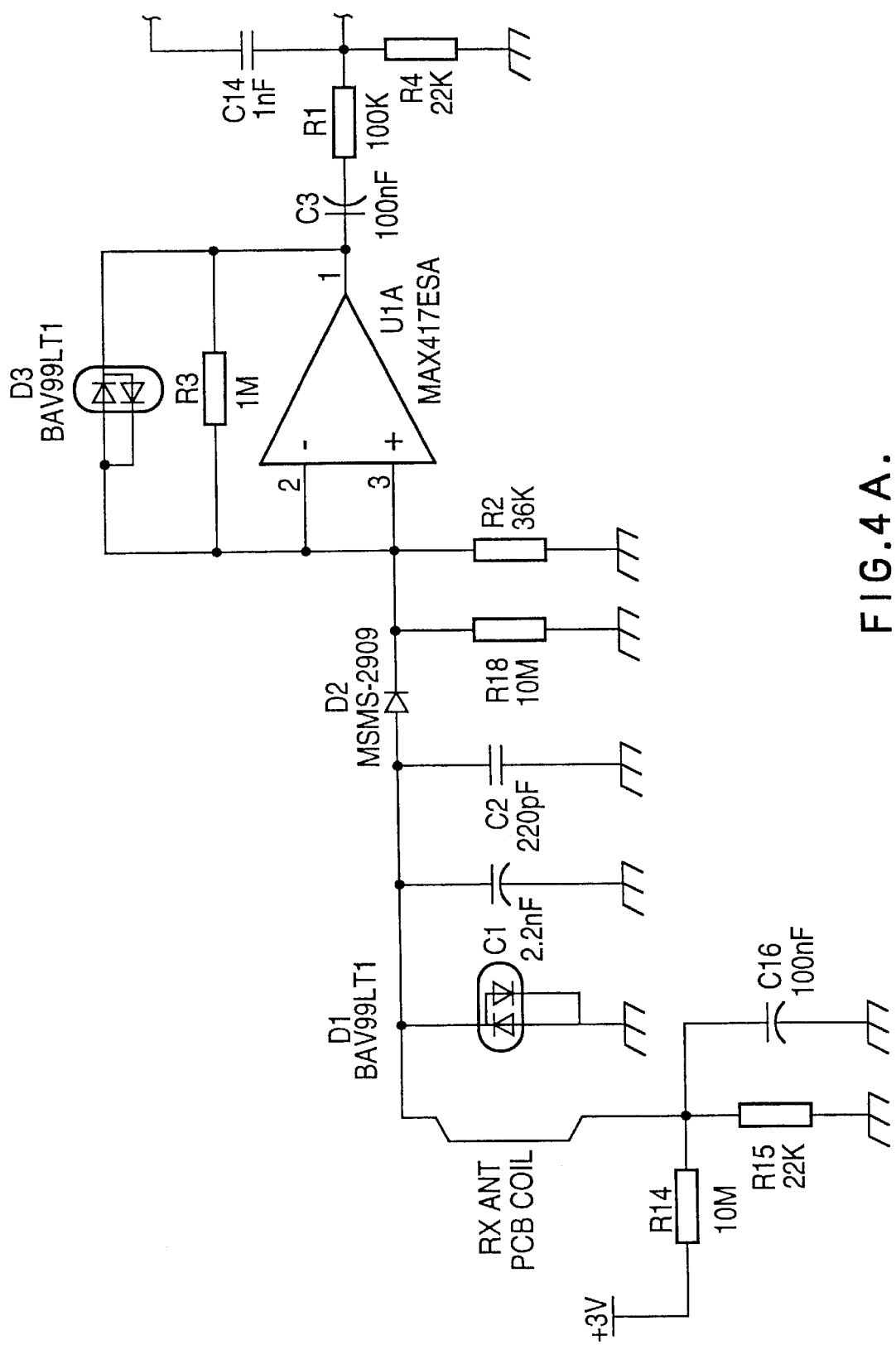
FIGS. 4A–4D are schematic diagrams of a representative circuit carried by the integrated circuit area of the tag shown in FIGS. 1–3.
Figure 4B:
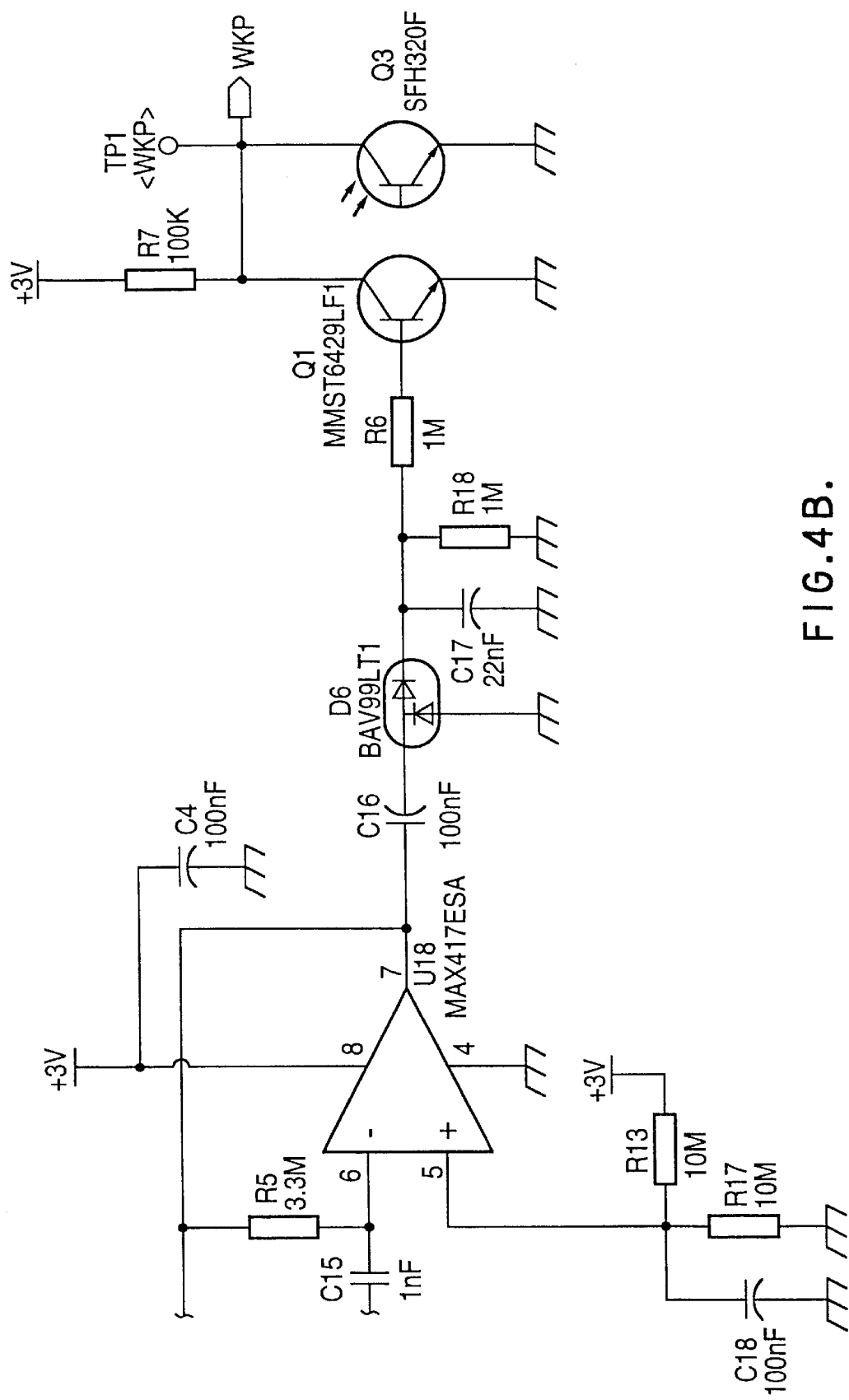
Figure 4C:
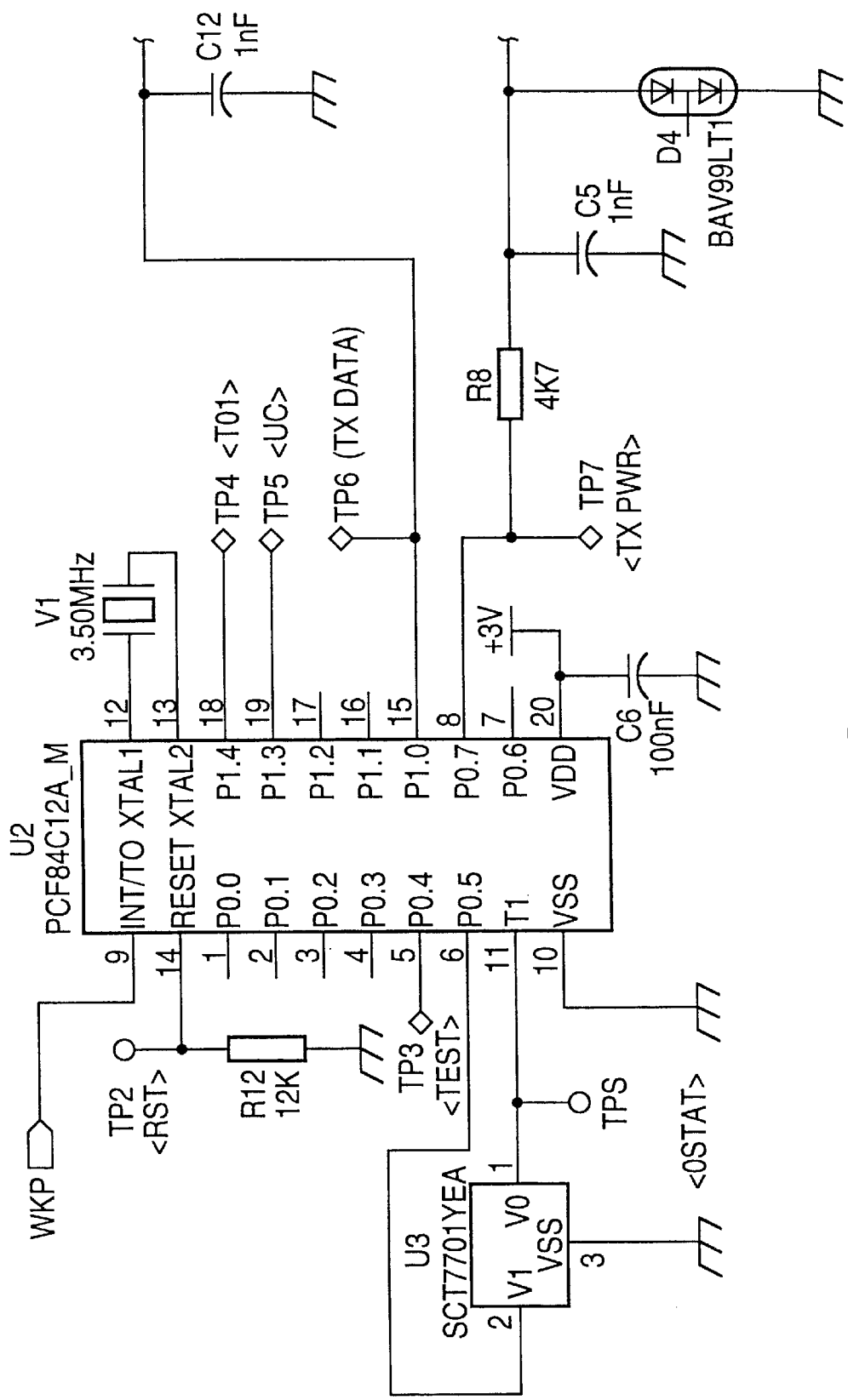
Figure 4D:
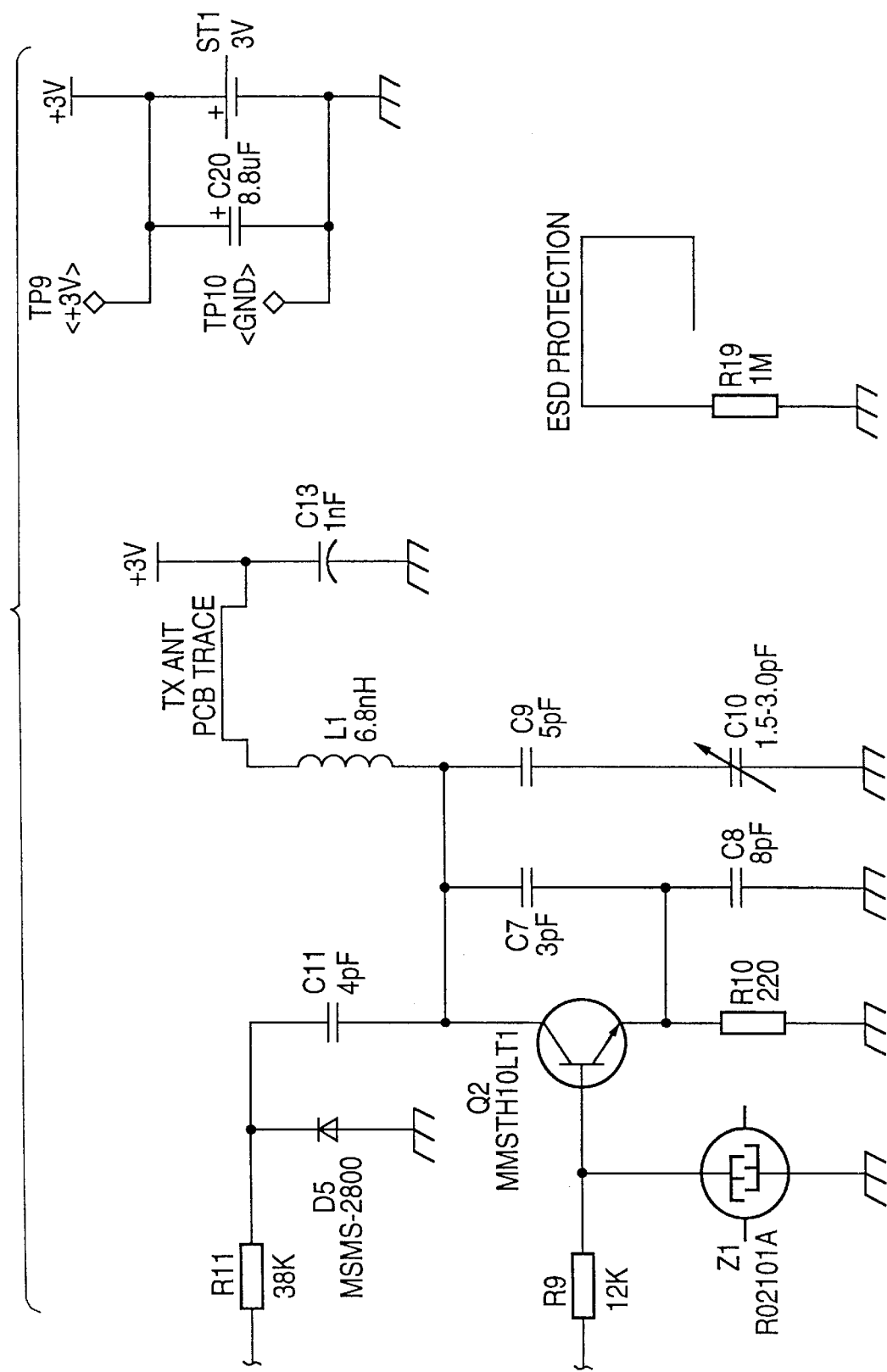

Turning now to FIGS. 4A–4D, schematic diagrams are shown of a preferred embodiment of receiver/transmitter sensing circuitry fabricated on the integrated circuit area 4 of the tag. The physical layout of these circuit elements is shown in the expanded view of FIG. 3.

The receive antenna section comprises an embedded antenna coil 2, tuning capacitors C1 and C2, a dual bi-directional diode clamp D1, and high sensitivity RF Schotky barrier diode D2.

Capacitors C1 and C2 are connected in parallel with the receive antenna 2 (i.e. interconnected antenna windings 2A and 2B). The values of capacitors C1 and C2 are selected based on the required receive signal frequency, inductance value of antenna 2 and parasitic capacitance of the embedded antenna 2, as discussed above. In the presence of the desired low frequency excitation signal, electromagnetic energy is coupled into the embedded antenna and the capacitors C1 and C2.

A dual bi-directional diode clamp D1 is placed in parallel with the receive antenna 2 to limit the signal amplitude. The signal is then half-wave rectified through diode D2, which is an RF Schotky barrier diode. The cathode of the diode D2 is connected to resistor R1 6. Because the resistance of diode D2 increases directly with temperature, resistor R1 6 is selected to be many times larger than the maximum resistance of diode D2, in order to ensure adequate signal levels at the input of amplifier U1A. According to the preferred embodiment shown in FIGS. 4A–4D, amplifier U1A is implemented as a MAX417ESA dual operational amplifier. The internal series capacitance of the MAX417ESA amplifier is approximately 2.0 pF. This capacitance combined with the high impedance input of U1A and the rectification provided by diode D2, results in peak voltage detection of the incoming signal. The resulting peak detected voltage is positive with respect to ground (minus the D2 forward voltage drop) and is completely dependent on the coupled energy from the incoming signal.

Resistors R14 and R15 are provided to compensate for variations in the voltage input offset characteristics of amplifiers U1A and U1B. According to the preferred embodiment illustrated, the MAX417ESA series dual operational amplifier has been found to consume excessive current when the difference in the two input voltages with respect to ground (the voltage between pins 2 and 3) is less than the characteristic input offset voltage for the amplifier. Nonetheless, the MAX417ESA dual operational amplifier was chosen in the preferred embodiment for its extremely low biasing current, which at the time of filing this application is apparently unavailable from any other component.

Resistors R14 and R15 are configured in series across the supply voltage for providing a voltage divider network whereby one terminal of the embedded antenna coil 2 is referenced through the junction of the two resistors. Resistor R15 is selected such that the voltage drop across R15 causes a positive voltage differential between pins 2 and 3 of operational amplifier U1A that is greater than the input offset characteristic of U1A.

The resistors R2 and R3 surrounding operational amplifier U1A are used to configure the amplifier as a non-inverting amplifier with a gain of 10 in the preferred embodiment. D3 is a bidirectional diode clamp and is placed across the feedback resistor R3 for providing automatic gain control. D3 has an equivalent resistance, $R_{D3}$, of 480K ohms in the preferred embodiment. The amplifier gain is given by:

$$A_A = 1 + ((R_3 R_{D3}/(R_3 + R_{D3}))/R_2)$$

Capacitor C3 is connected from the output of U1A to the input of a band pass filter comprising the components R1, C14, R4, C15, R5, R17, R13 surrounding U1B, thereby creating a second order band pass filter with a gain of 16.5 and a passband of 80 Hz centered at 610 Hz. Capacitor C3 AC couples the signal from the first stage amplifier U1A to the second stage amplifier U1A to the second stage band pass filter. The amplifier gain is given by:

$$A_B = R_5/2R_1$$

The pass band is given by:

$$\Delta\omega = 2/C_{15} R_5$$

The center frequency is given by:

$$\omega_0 = \frac{1}{C_{15}\sqrt{R_5 \frac{R_1 R_2}{R_1 + R_4}}}$$

The two amplifiers U1A and U1B are cascaded together to provide a total gain of 165.5, as follows:

$$A_t = A_A \times A_B$$

The output of U1B is connected to capacitor C16 which couples the signal to a peak detector circuit comprising D6, C17 and R18. Dual diode D6 comprises two diodes, and when configured as per the preferred embodiment, conducts during the negative cycle of the amplified signal, hereby charging capacitor C16. During the negative cycle of the amplified signal, diode D6A does not conduct and therefore blocks negative current flow.

The positive charge accumulated across capacitor C16 is added to the signal on the next positive cycle of the detected signal effectively boosting the voltage that appears across capacitor C17. Resistor R6 is connected from the node of capacitor C17 and resistor R18 to the base of transistor Q1. When the resulting voltage across the peak detector circuit exceeds the turn on voltage of Q1 (which in the preferred embodiment, is at 0.45 volts) transistor Q1 turns on, thereby pulling the voltage across resistor R7 to ground. Thus, transistor Q1 operates as a switch. Transistor Q3 is connected in parallel with Q1. Transistor Q3 is a phototransistor that is specifically used for writing information into the microprocessor of the tag. When exposed to infrared light, transistor Q3 turns on. Information is sent to the tag by modulating the infrared light with encoded information.

The remaining portions of the circuitry shown in FIGS. 4A–4D, are substantially identical to the circuitry disclosed in applicant's co-pending U.S. application Ser. No. 946,425 filed May 1, 1991, the subject matter of which is incorporated herein by reference.

Figure 5A:
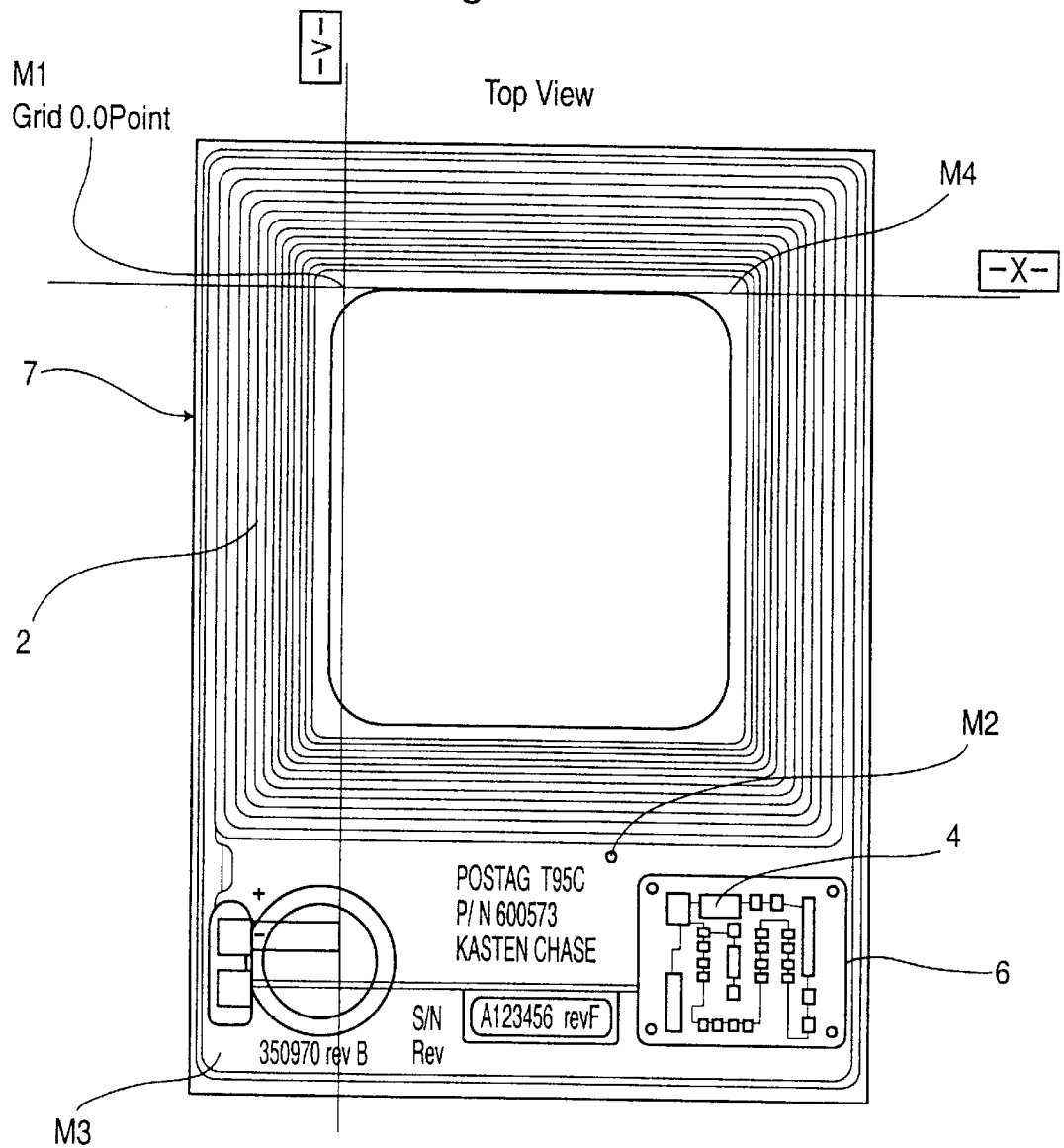
FIG. 5A is a top plan view of a second embodiment of the radio frequency identification tag according to the present invention.
Figure 5B:
FIG. 5B is a side-elevational view of the tag shown in FIG. 5A.
Figure 5C:
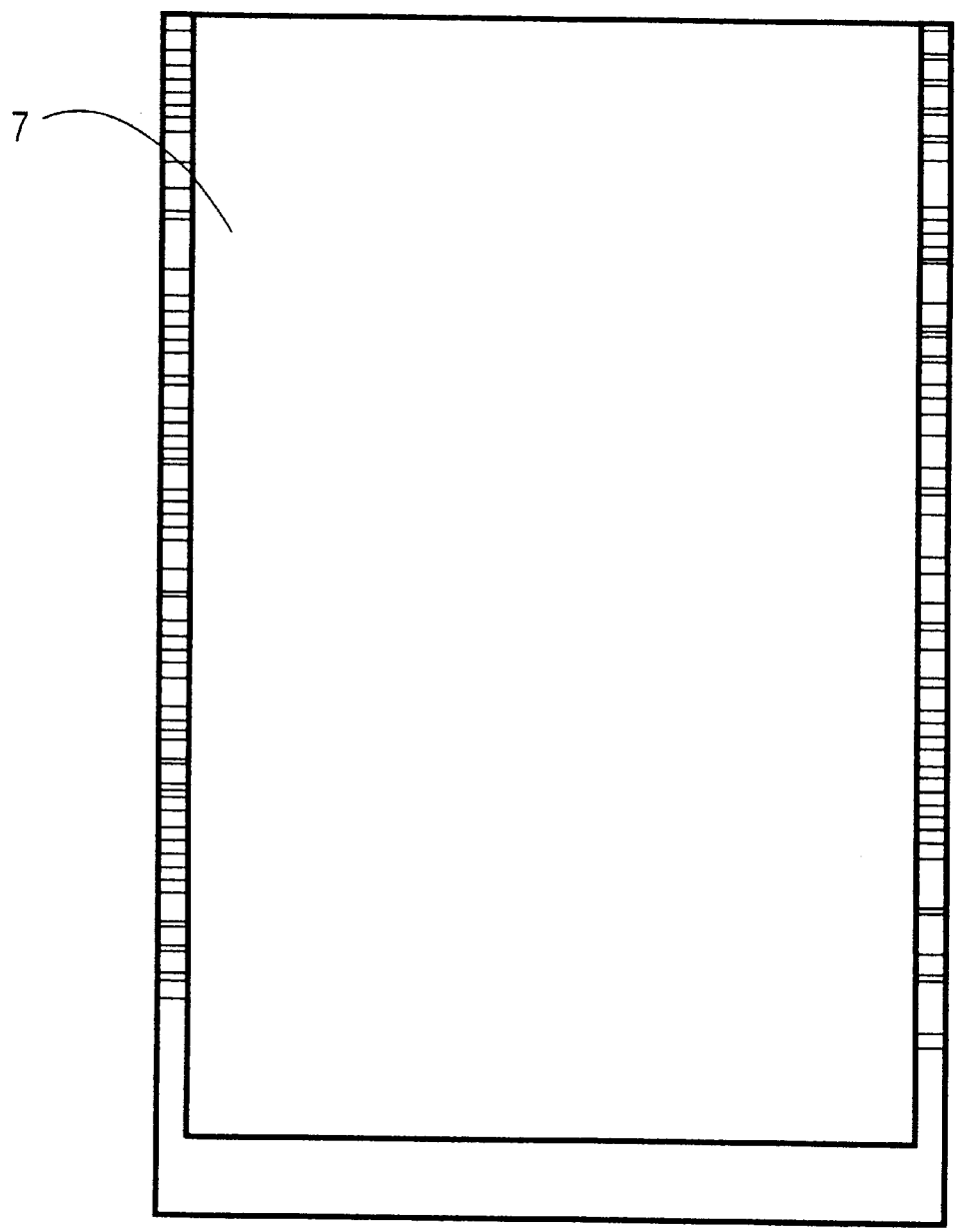
FIG. 5C is a top plan view of the polyester bag as used to seal the assembled tag.

A second embodiment of the invention is shown in FIGS. 5A and 5B. In this figure a radio frequency tag is shown in accordance with the present invention having a flexible substrate 1 on opposite sides of which a receive antenna coil 2 is provided. In this embodiment, the entire circuit area 4 with the exception of the low frequency antenna and battery is manufactured onto a thin FR4 glass laminate substrate 6. This improves the frequency stability of the UHF circuit. The circuitry on the FR4 substrate includes: the low frequency amplifier circuit, micro controller and clock oscillator circuitry, low battery detection circuit, UHF oscillator and UHF antenna. The FR4 glass laminate material provides better stability over the operating range with respect to the effects of humidity and temperature. The FR4 substrate with circuitry is laminated on to the flexible substrate. A 3M die cut adhesive is used in the lamination process to secure the FR4 circuit board to the flexible substrate. Large holes on the flexible substrate permit electrical connections through soldering to the pads on the FR4 substrate. Additional precut holes in the flex substrate permit access to test pads on the FR4. This permits the unit to be tested after assembly. The circuitry area is then encapsulated as previously described. In this second embodiment of the invention gold plating the etched printed circuit board is not required.

Furthermore, in this second embodiment of the invention, a polyester bag 7 (e.g. Melinex™) is used rather than the Mylar™ laminate to enclose or encase the entire radio frequency identification tag. Such bag is illustrated in FIG. 5B. The assembled tag is inserted into a polyester or like-material bag and then vacuum sealed. Once the bag is sealed the remaining area of the bag where polyester meets polyester is laminated together as is known by those skilled in the art. The provision of the assembled radio frequency identification tag vacuum sealed within a polyester bag prevents movement of the circuit assembly and minimizes the probability of breach of the vacuum seal. Any excess portions of polyester laminated bag not required may be trimmed away. The polyester bag also serves as a slip surface for the tag allowing it to "slip" through the rollers and belts of a sorting machine in the preferred use of the present invention.

Figure 6A:
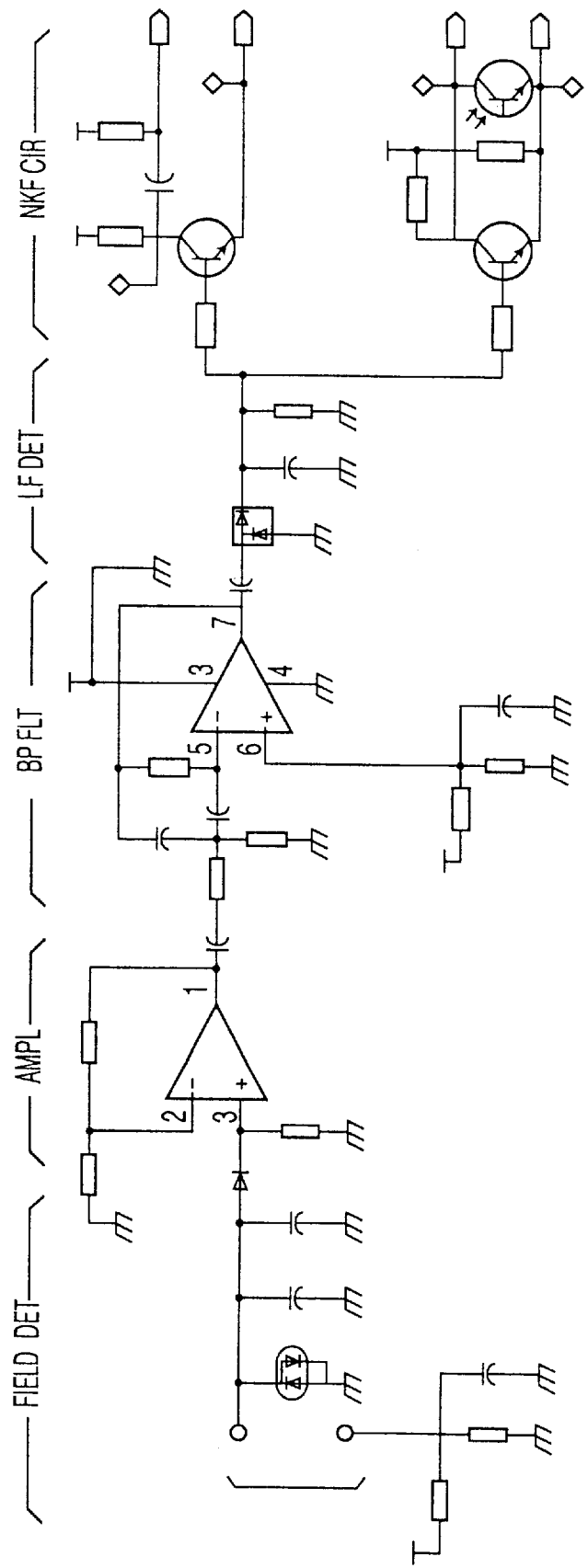
FIGS. 6A–6F are schematic diagrams of a second representative circuit carried by the integrated circuit area of the tag shown in FIG. 5A.
Figure 6C:
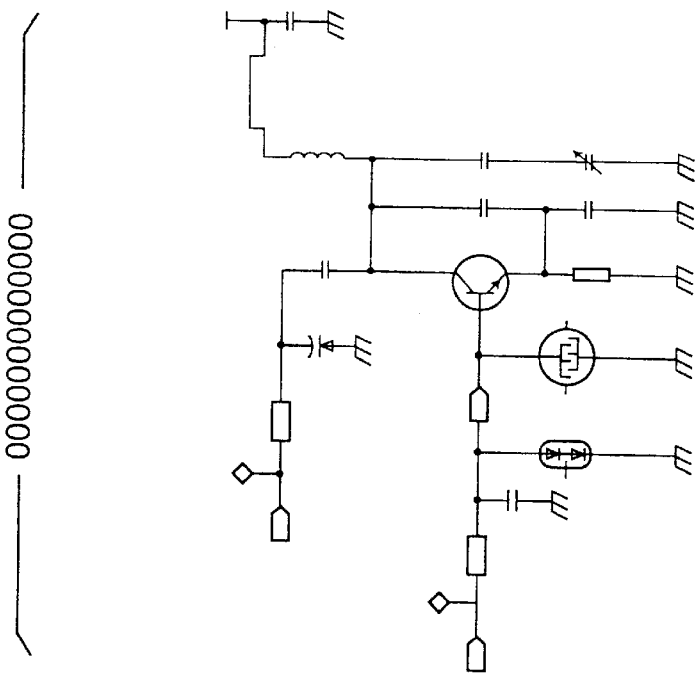
Figure 6B:
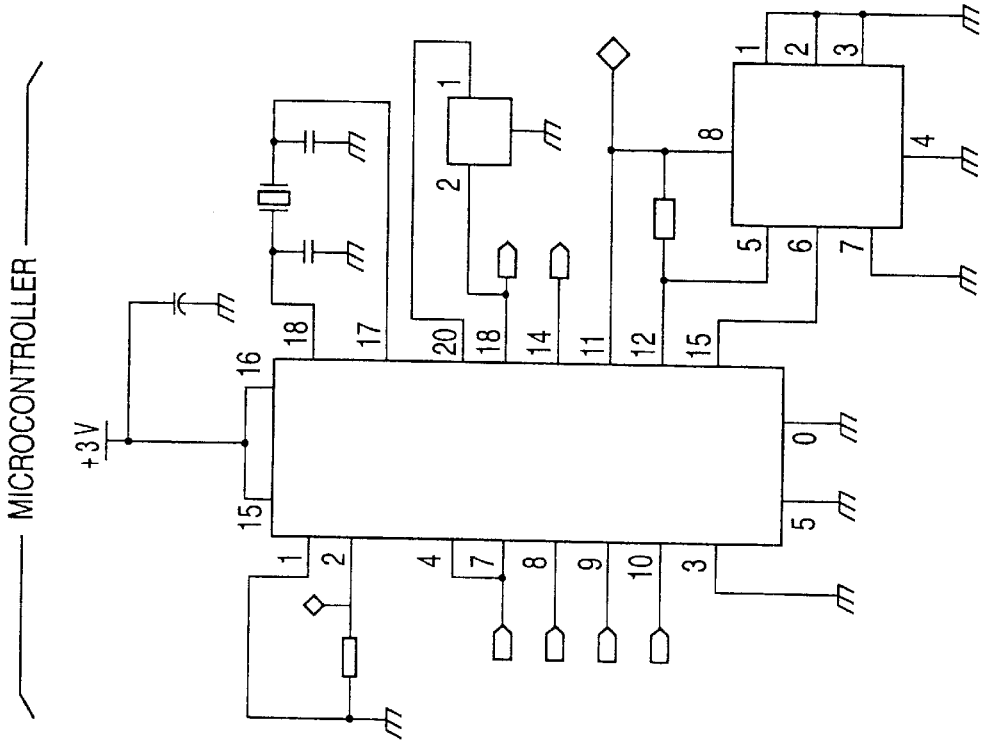
Figure 6D:
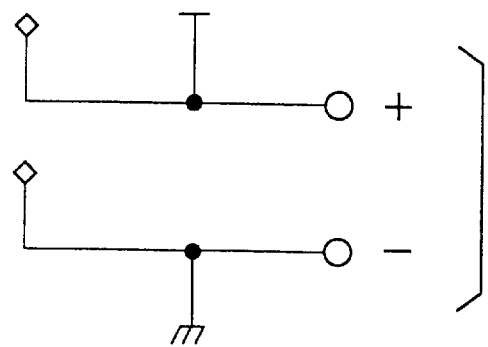
Figure 6E:
Figure 6F:
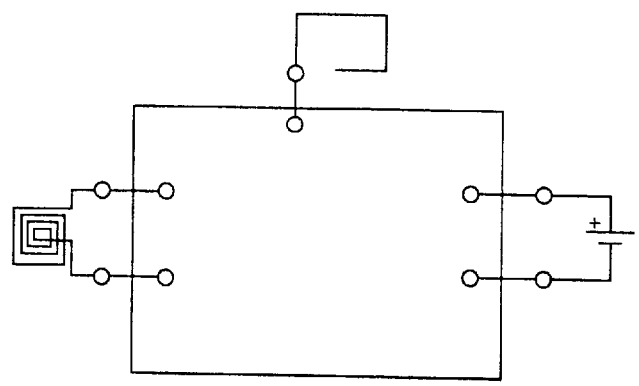

Schematic diagrams of a further embodiment of receiver/transmitter sensing circuitry are shown in FIGS. 6A and 6F.

After processing, the printed circuit board (PCB) formed on substrate 1 is characterized by the following specifications:

Total weight of assembly: max 12.0 g

Overall assembly thickness: Max 2.8 mm

Total weight of the PCB: 4.5–4.9 g

Overall PCB thickness: 0.23–0.25 mils

Coil inductance: (670–811)1H at 128.25 kHz

Coil Q (quality factor): 7.5–10.0 at 128.25 kHz

In summary, according to the present invention, a radio frequency identification tag is provided which is of robust, flexible design. The tag exhibits greater efficiency, lower cost and lower weight than prior art designs, and is capable of withstanding considerable stresses experienced in applications such as mail efficiency processing measurement.

Other embodiments and variations of the invention are possible. For example, although the preferred embodiment is directed to radio frequency identification tag for mail sorting efficiency applications, the flexible substrate of the present invention with imbedded antenna coil and adjacent semi-rigid circuit component area, may be utilized in different configurations for different applications such as inventory control, vehicle identification, etc. All such alternative embodiments and configurations are believed to be within the sphere and scope of the claims as appended hereto.

What is claimed is:

1. A printed circuit adapted for RF identification and processing through sorting apparatus, the printed circuit comprising:

a) a thin layer of flexible circuit board;

b) an imbedded antenna coil printed on at least one side of a first area of said flexible circuit board;

c) an integrated circuit provided on a laminate substrate and mounted on top of a second area of said flexible circuit board substrate laterally adjacent said imbedded antenna coil for carrying circuit elements;

d) electrical connection means extending laterally between the first area and the second area to connect electrically said antenna coil and said integrated circuit; and e) a layer of semi-rigid material encapsulating only said integrated circuit in the second area having a limited degree of flexibility which is less than a degree of flexibility of the substrate.

2. The printed circuit of claim 1, wherein said layer of semi-rigid material, said flexible circuit board substrate with imbedded antenna coil and said electrical connection means are provided with a slip surface over said circuit elements.

3. The printed circuit of claim 2, wherein said slip surface comprises a membrane laid over said layer of semi-rigid material, said flexible circuit board substrate with imbedded antenna coil and said electrical connection means.

4. The printed circuit of claim 2, wherein said slip surface comprises a polyester bag vacuum sealed onto the entire flexible circuit board substrate with imbedded antenna coil and said electrical connection means.

5. The printed circuit of claim 1, wherein said integrated circuit is provided on a glass laminate substrate.

6. The printed circuit of claim 1, wherein said antenna coil comprises a first winding printed on one side of said substrate, and a second winding printed on an opposite side of said substrate, said first and second windings being connected together at one end through said substrate and to said electrical connection means at respective opposite ends thereof.

7. The printed circuit of claim 6 wherein said first and second windings are offset from each other to reduce parasitic capacitance therebetween.

8. The printed circuit of claim 1, wherein said electrical connection means comprises a plurality of electrically conducting traces deposited on said substrate.

9. The printed circuit of claim 1, further comprising gold plating applied to said antenna coil for increasing conductivity thereof.

10. The printed circuit of claim 2, further comprising a resistive coating deposited on said slip surface for reducing electrostatic charge build-up and decreasing surface charge and discharge currents thereon.

11. The printed circuit board of claim 1, wherein said layer of semi-rigid material comprises UV adhesive.

12. The printed circuit board of claim 11, wherein the UV adhesive provides a limited degree of flexibility to prevent cracking and fracturing of the adhesive under stresses administered by automated postal equipment.

13. The printed circuit board of claim 1, wherein said integrated circuit area houses a plurality of electrical and electronic components in one portion thereof connected to a battery in another portion thereof.

14. The printed circuit board of claim 1, wherein the total weight of the printed circuit board does not exceed approximately 6.0 g.

15. The printed circuit board of claim 1, wherein the substrate has a core thickness of approximately 8 mils.

16. The printed circuit of claim 1, wherein a battery to power said printed circuit is provided adjacent said integrated circuit, said battery being connected to said imbedded antenna coil and said integrated circuit.

* * * * *